(12) United States Patent
Kang et al.

(10) Patent No.: US 7,592,206 B2
(45) Date of Patent: Sep. 22, 2009

(54) FUSE REGION AND METHOD OF FABRICATING THE SAME

(75) Inventors: Eung-Youl Kang, Seoul (KR); Won-Chul Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 231 days.

(21) Appl. No.: 11/457,787

(22) Filed: Jul. 14, 2006

(65) Prior Publication Data

US 2007/0170545 A1    Jul. 26, 2007

(30) Foreign Application Priority Data

Jan. 12, 2006    (KR)    .................... 10-2006-0003563

(51) Int. Cl.
*H01L 21/82* (2006.01)
(52) U.S. Cl. .................. 438/132; 438/601; 257/530; 257/E23.149
(58) Field of Classification Search .............. 438/601, 438/132, 333, 215; 257/209, 530, E23.149
See application file for complete search history.

(56) References Cited

U.S. PATENT DOCUMENTS

| 6,638,795 B2 | 10/2003 | Ikeda et al. | |
| 6,753,210 B2 * | 6/2004 | Jeng et al. | 438/132 |
| 2002/0014680 A1 * | 2/2002 | Tottori | 257/529 |
| 2004/0150054 A1 * | 8/2004 | Hirano | 257/371 |
| 2004/0262768 A1 * | 12/2004 | Cho et al. | 257/758 |

FOREIGN PATENT DOCUMENTS

| CN | 1467815 A | 1/2004 |
| JP | 2003-017572 | 1/2003 |
| JP | 2003-045970 | 2/2003 |
| KR | 2002-0028117 | 4/2002 |
| KR | 2004-0008455 | 1/2004 |

OTHER PUBLICATIONS

English language abstract of Korean Publication No. 2002-0028117.
English language abstract of Korean Publication No. 2004-0008455.
English language abstract of Japanese Publication No. 2003-045970.

* cited by examiner

*Primary Examiner*—Asok K Sarkar
*Assistant Examiner*—Julia Slutsker
(74) *Attorney, Agent, or Firm*—Marger Johnson & McCollom, P.C.

(57) ABSTRACT

In one embodiment a fuse region includes an insulating layer disposed on a substrate, a fuse disposed on the insulating layer and including a fuse barrier pattern and a fuse conductive pattern, which are stacked, and a supporting plug disposed beneath the fuse, and penetrating the insulating layer and the fuse barrier pattern.

11 Claims, 12 Drawing Sheets

FUSE REGION AND METHOD OF FABRICATING THE SAME

CROSS-REFERENCE TO RELATED APPLICATION

This application claims priority from Korean Patent Application No. 2006-0003563, filed Jan. 12, 2006, the disclosure of which is hereby incorporated herein by reference in its entirety as if set forth fully herein.

BACKGROUND

1. Technical Field

This disclosure relates to a semiconductor device and a method of fabricating the same, and more particularly, to a fuse region and a method of fabricating the same

2. Discussion of the Related Art

Semiconductor memory devices (chips) formed on a semiconductor substrate are electrically tested prior to an assembly process. As a result of the test, semiconductor memory devices are classified as bad chips or good chips. A bad chip may include a failed cell. If a bad chip does have at least one failed cell, the failed cell may be replaced with a redundant cell though a repair process. The repair process includes the use of a laser to blow predetermined fuses so that the redundant cell responds to an address of the failed cell during a writing mode and a reading mode.

The fuses are generally formed of a metal layer. A fuse may include a barrier layer in addition to the metal layer. The barrier layer may include a titanium layer and a titanium nitride layer, which are stacked. However, when evaluating a reliability of a fuse or when using a laser beam, the titanium nitride barrier layer may experience thermal expansion. The expansion of the titanium nitride barrier layer may apply stress on a middle portion of the fuse, and consequently may cause the fuse to break.

SUMMARY

An embodiment includes fuse region includes an insulating layer disposed on a substrate, a fuse disposed on the insulating layer and including a fuse barrier pattern and a fuse conductive pattern, which are stacked, a supporting plug disposed beneath the fuse, and penetrating the insulating layer and the fuse barrier pattern.

BRIEF DESCRIPTION OF THE DRAWINGS

The above and other features and advantages will become more apparent to those of ordinary skill in the art by describing embodiments in detail with reference to the attached drawings in which.

DETAILED DESCRIPTION

Embodiments will now be described more fully hereinafter with reference to the accompanying drawings. Embodiments may take many different forms and should not be construed as being limited to the embodiments set forth herein. Rather, these embodiments are provided so that this disclosure will be thorough and complete, and will fully convey the scope of the following claims to those skilled in the art. In the drawings, the thicknesses of layers and regions may be exaggerated for clarity. Like numbers refer to like elements throughout the specification.

Figure 1:
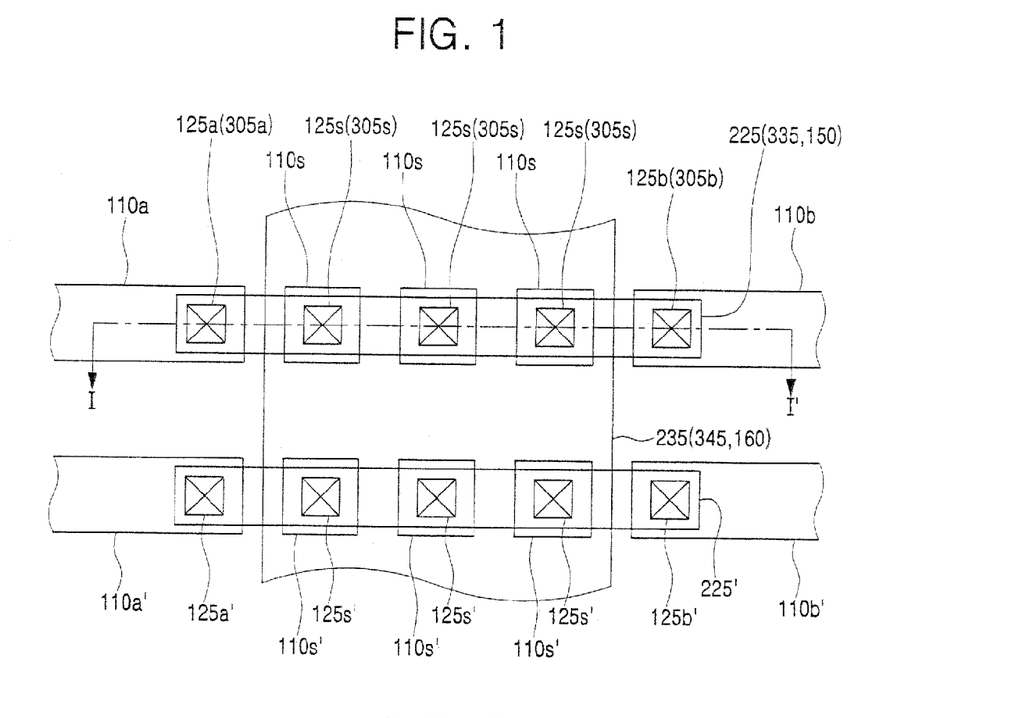
FIGS. 1 and 2 are plan views illustrating a fuse region according to embodiments.
Figure 2:
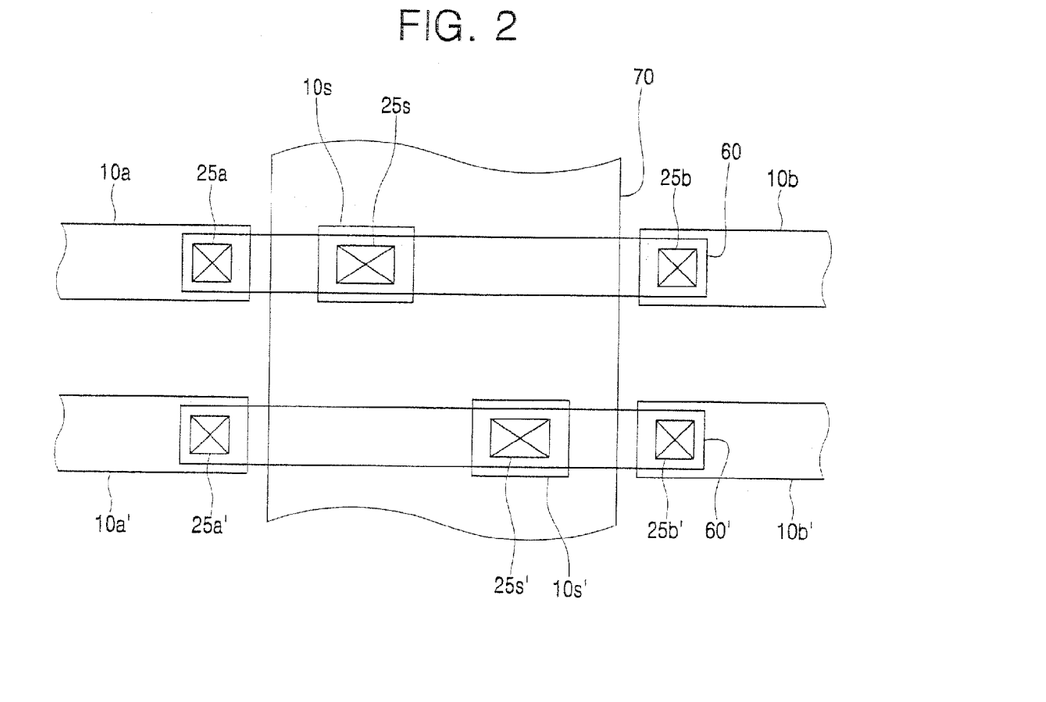

FIGS. 1 and 2 are plan views illustrating a fuse region according to embodiments, and FIGS. 3 through 13 are sectional views taken along a line I-I' of FIG. 1 illustrating embodiments of a method of fabricating a fuse region.

First, a fuse region according to an embodiment will be explained in reference to FIGS. 1 and 7.

Figure 7:
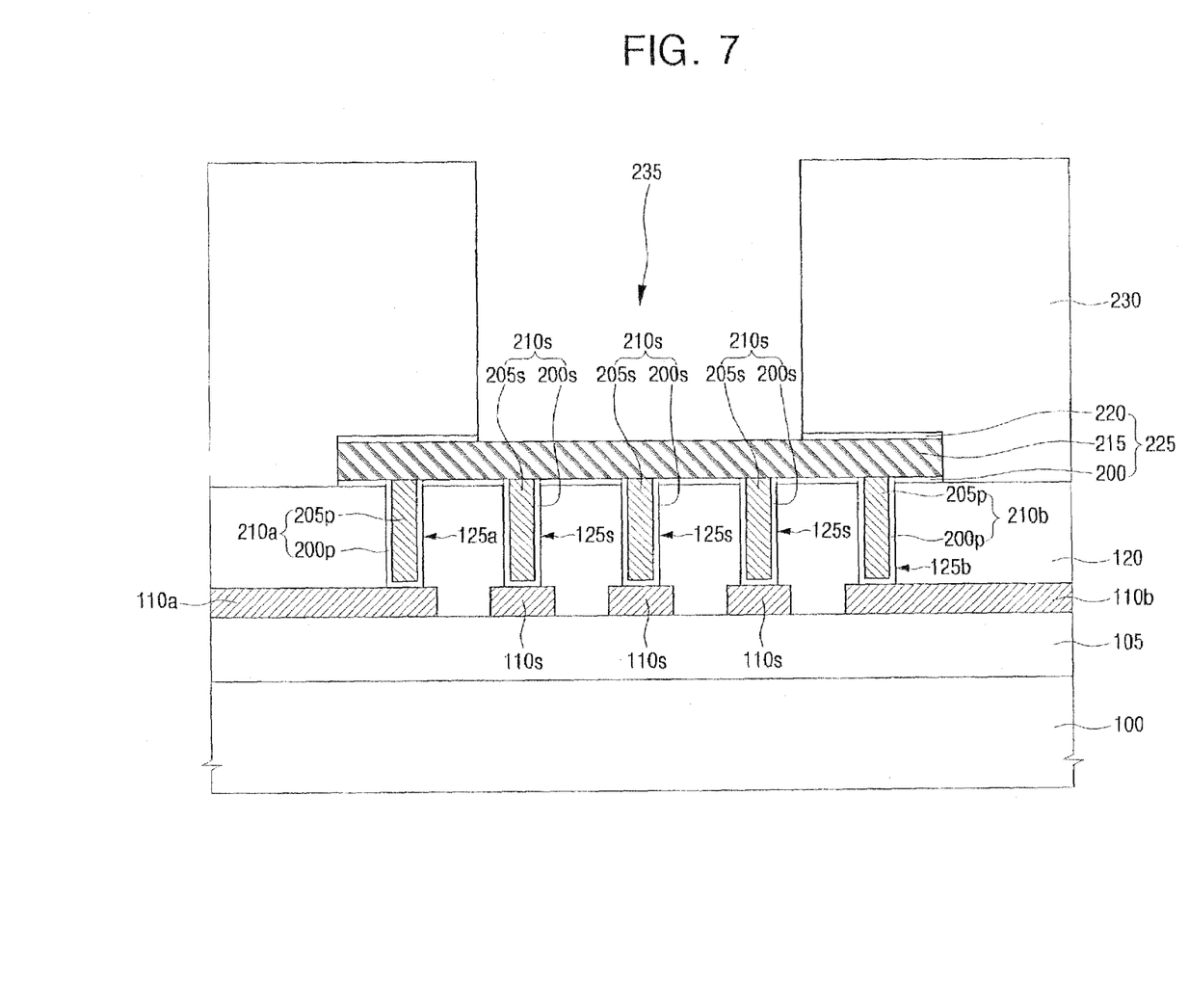

Referring to FIGS. 1 and 7, a surface of a semiconductor substrate 100 is covered by a lower insulating layer 105. The lower insulating layer 105 may be an isolation layer, or may be an interlayer insulating layer covering lower interconnections disposed on the substrate. First through fourth interconnections 110$a$, 110$b$, 110$a'$, and 110$b'$ are disposed on the lower insulating layer 105. The first and second interconnections 110$a$ and 110$b$ may be disposed on a first straight line, and may be spaced apart from each other. Further, the third and fourth interconnections 110$a'$ and 110$b'$ may be disposed on a second straight line in parallel with the first straight line. The third interconnection 110$a'$ may be disposed adjacent to the first interconnection 110$a$, and the fourth interconnection 110$b'$ may be disposed in adjacent to the second interconnection 110$b$. The array arrangement of the first through fourth interconnections 110$a$, 110$b$, 110$a'$, and 110$b'$ is not limited to the array as described above. For example, the first and second interconnections 110$a$ and 110$b$ may not be disposed in the first straight line, and an interval between the first and third interconnections 110$a$ and 110$a'$ may be equal to or may be different from an interval between the second and fourth interconnections 110$b$ and 110$b'$.

At least one first supporting pattern 110$s$ is provided on the lower insulating layer 105, and is disposed between the first and second interconnections 110$a$ and 110$b$. At least one second supporting pattern 110$s'$ is provided between the third and fourth interconnections 110$a'$ and 110$b'$. The supporting patterns 110$s$ and 110$s'$, and the first through fourth interconnections 110$a$, 110$b$, 110$a'$ and 110$b'$ may be disposed at a same height level. Alternatively, the supporting patterns 110$s$ and 110$s'$, and the first through fourth interconnections 110$a$, 110$b$, 110$a'$ and 110$b'$ may be disposed at different height levels. For example, the first through fourth interconnections 110$a$, 110$b$, 110$a'$ and 110$b'$ may be disposed below the supporting patterns 110$s$ and 110$s'$. The supporting patterns 110$s$ and 110$s'$ may be formed of the same material layer as that of the first through fourth interconnections 110$a$, 110$b$, 110$a'$ and 110'$b$.

An insulating layer 120 covers the supporting patterns 110$s$ and 110$s'$ and the first through fourth interconnections 110$a$, 110$b$, 110$a'$ and 110$b'$. First and second contact holes 125$a$ and 125$b$ penetrate the insulating layer 120 and expose the first and second interconnections 110$a$ and 110$b$ respectively. First and second contact plugs 210$a$ and 210$b$ fill the first and second contact holes 125$a$ and 125$b$ and contact the first and second interconnections 110$a$ and 110$b$ respectively. Third and fourth contact plugs penetrate the insulating layer 120, and fill the third and fourth contact holes 125$a'$ and 125$b'$ exposing the third and fourth interconnections 110$a'$ and 110$b'$ respectively, corresponding to the first and second contact plugs 210$a$ and 210$b$. A first supporting plug 210$s$ between the first and second contact plugs 210$a$ and 210$b$ fills the first supporting contact hole 125$s$ exposing the first supporting pattern 110$s$. When multiple first supporting patterns 110$s$ are provided, multiple first supporting plugs 210$s$ may be provided. A second supporting plug between the third and fourth contact plugs to fill the second supporting contact hole 125s' exposing the second supporting pattern 110s'. When multiple second supporting patterns 110s' are provided, multiple second supporting plugs may be provided.

Each of the first and second contact plugs 210a and 210b may include a contact layer 205p and a contact barrier layer 200p surrounding the contact layer 205p. The first supporting plug 210s may include a plug layer 205s and a plug barrier layer 200s surrounding the plug layer 205s. The plug layer 205s may be formed of a metal layer such as a tungsten layer or an aluminum layer, and the plug barrier layer 200s may be composed of a titanium layer and a titanium nitride layer, which are stacked. The contact layer 205p may be the same material or the same layer as that of the plug layer 205s, and the contact barrier layer 200p may be the same material or the same layer as that of the plug barrier layer 200s. Alternatively, the contact layer 205p and the plug layer 205s may be different materials, and the contact barrier layer 200p and the plug barrier layer 200s may be different materials. The third and fourth contact plugs may be the same material layer as those of the first and second contact plugs 210a and 210b, and the second supporting plug may be the same material layer as that of the first supporting plug 210s.

A first fuse 225 on the insulating layer 120 covers the first and second contact plugs 210a and 210b, and the first supporting plug 210s. A second fuse 225' is provided on the insulating layer 120 to cover the third and fourth contact plugs and the second supporting plug. Each of the first and second fuses 225 and 225' may include a fuse barrier pattern 200, a fuse conductive pattern 215, and an anti-reflective pattern 220, which are stacked. The fuse barrier pattern 200 may be the same material layer as that of the plug barrier layer 200s, for example, may include a titanium layer and a titanium nitride layer, which are stacked. The first and second contact plugs 210a and 210b, and the first supporting plug 210s may penetrate the fuse barrier pattern 200 of the first fuse 225. That is, the contact layers 205p of the first and second contact plugs 210a and 210b, and the plug layer 205s of the first supporting plug 210s may directly contact the fuse conductive pattern 215.

In the second fuse 225', the third and fourth contact plugs and the second supporting plug may similarly contact the fuse conductive pattern 215. As a result, a fuse barrier pattern 200 is not located between the interfaces between the fuses 225 and 225' and the plugs 210a, 210b, and 210s. Thus, the contact area between the fuse barrier pattern 200 and the fuse conductive pattern 215 may be reduced as compared to that in the related art. In this case, even though the fuse barrier pattern 200 expands due to oxidation and/or thermal energy during a fuse test process or when using a laser beam, a stress applied to the fuses 225 and 225' may be significantly reduced as compared to that in the related art. For example, when one of the fuses 225 and 225' is blown by laser beam, the thermal energy of the laser beam can be transferred to the fuse barrier pattern of a non-selected fuse adjacent to the selected fuse. However, the damage of the non-selected fuse can be prevented. This is because the contact area between the fuse conductive pattern and the fuse barrier pattern of the non-selected fuse is smaller than that of the related art as described above.

The fuse conductive pattern 215 may include a metal layer such as an aluminum layer. The anti-reflective pattern 220 may include a titanium nitride layer. The first fuse 225 electrically connects the first interconnection 110a and the second interconnection 110b. The second fuse 225' electrically connects the third interconnection 110a' and the fourth interconnection 110b'. An upper insulating layer 230 is disposed on the substrate having the first and second fuses 225 and 225'.

The upper insulating layer 230 may include a lower passivation layer such as a plasma oxide layer, and an upper passivation layer such as a plasma nitride layer. A fuse window 235 penetrates the upper insulating layer 230 to expose first and second fuses 225 and 225'.

The fuse window 235 may penetrate the anti-reflective pattern 220 as well as the upper insulating layer 230 to expose the fuse conductive pattern 215. In addition, the fuse window 235 may partially penetrate the fuse conductive pattern 215 such that a portion of the fuse conductive pattern 215 has relatively thinner thickness.

FIG. 2 is a plan view illustrating a fuse region according to another embodiment. Since the fuse region has the same stack structure as the stack structure illustrated in FIG. 7, the fuse region according to this embodiment will be explained only in reference to FIG. 2.

Referring to FIG. 2, first through fourth interconnections 10a, 10b, 10a', and 10b' are disposed on the substrate. The first and second interconnections 10a and 10b may be disposed on a first straight line offset from each other. The third and fourth interconnections 10a' and 10b' may be disposed on a second straight line adjacent to the first straight line. The third interconnection 10a' is disposed adjacent to the first interconnection 10a, and the fourth interconnection 10b' is disposed adjacent to the second interconnection 10b. At least one first supporting pattern 10s is on the substrate between the first and second interconnections 10a and 10b. A second supporting pattern 10s' is provided between the third and fourth interconnections 10a' and 10b'. As illustrated in FIG. 2, the first supporting pattern 10s may be disposed adjacent to the first interconnection 10a, and the second supporting pattern 10s' may be disposed in adjacent to the fourth interconnection 10b'. That is, from the plan view, the first and second supporting patterns 10s and 10s' may be diagonally offset.

An insulating layer is provided to cover the supporting patterns 10s and 10s', and the first through fourth interconnections 10a, 10b, 10a', and 10b', and first and second contact holes 25a and 25b are provided to penetrate the insulating layer so as to expose the first and second interconnections 10a and 10b respectively. Third and fourth contact holes 25a' and 25b' are also provided to expose the third and fourth interconnections 10a' and 10b'. At least one first supporting contact hole 25s exposes the first supporting pattern 10s between the first and second contact holes 25a and 25b at a position adjacent to the first interconnection 10a. At least one second supporting contact hole 25s' exposes the second supporting pattern 10s' between the third and fourth contact holes 25a' and 25b' at a position adjacent to the fourth interconnection 10b'. First through fourth contact holes 25a, 25b, 25a', and 25b' are filled with first through fourth contact plugs respectively. The first and second supporting contact holes 25s and 25s' are filled with first and second supporting plugs respectively. A first fuse 60 covers the first and second contact plugs and the first supporting plug, and a second fuse 60' covers the third and fourth contact plugs and the second supporting plug.

A laser beam may be used for blowing the first fuse 60 and the second fuse 60. Since a supporting plug is located below the non-selected fuse adjacent to the portion where the laser beam is used, when one of the fuses 60 and 60' is selected and blown, the stress caused by the thermal energy of the laser beam can be reduced.

A method of fabricating a fuse region according to embodiments will be explained in reference to FIG. 1 and FIGS. 3 through 13.

Figure 3:
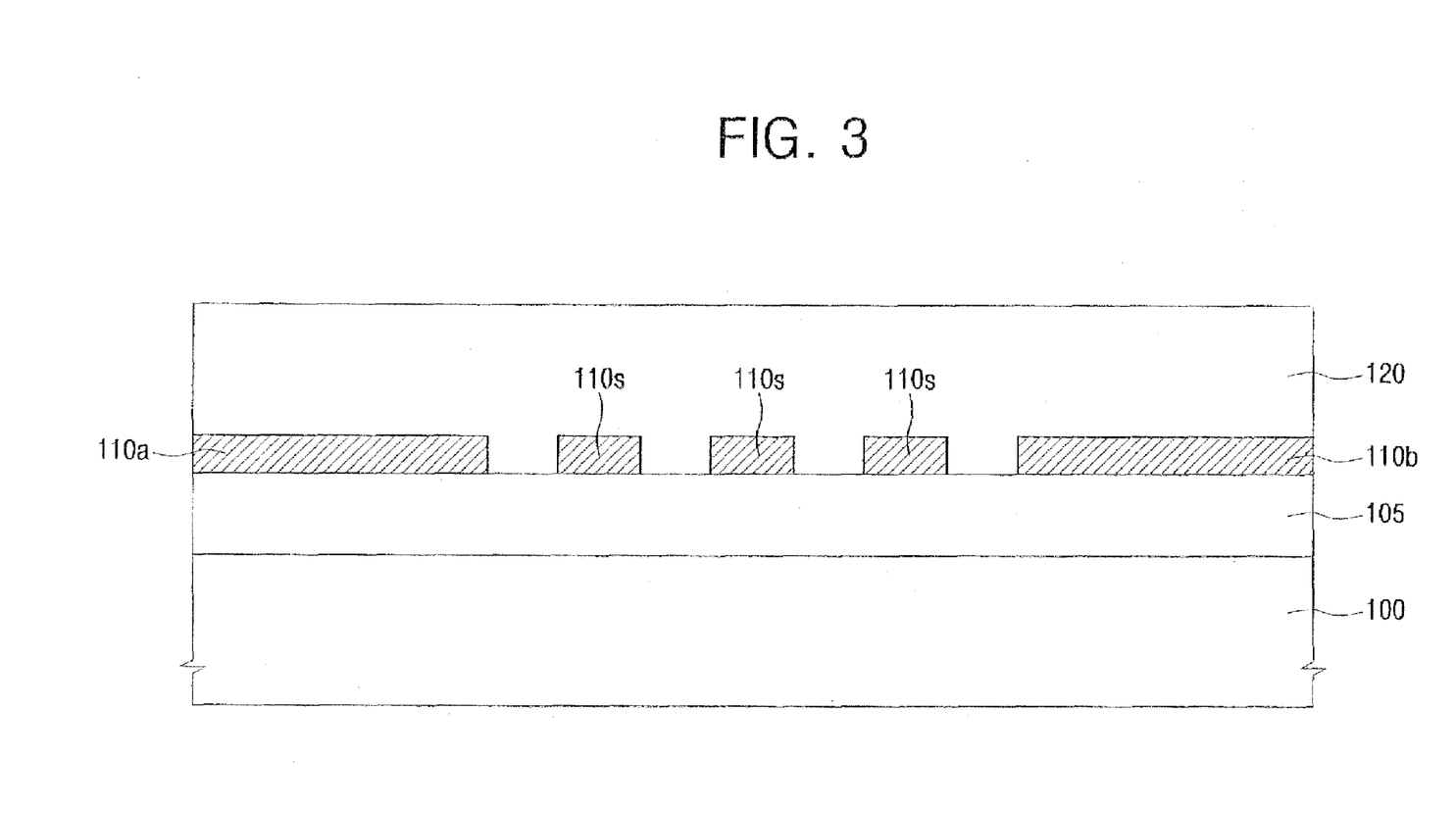
FIGS. 3 through 13 are sectional views taken along a line I-I' of FIG. 1 illustrating embodiments of a method of fabricating a fuse region.
Figure 4:
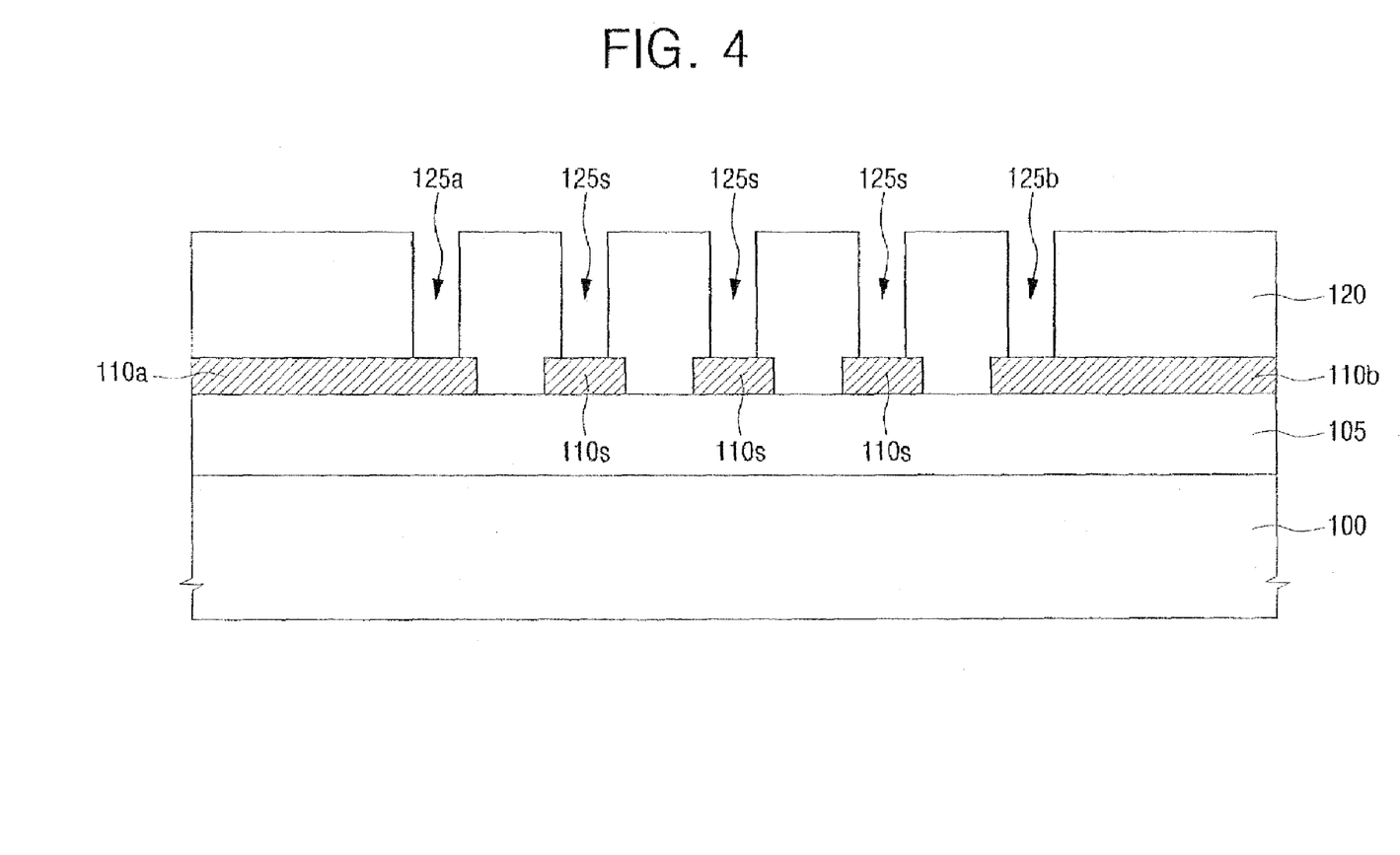

Referring to FIGS. 1, 3 and 4, a lower insulating layer 105 is formed on a semiconductor substrate 100. A conductive layer is formed on the lower insulating layer 105. The conductive layer may be a bit line conductive layer. In this case, the conductive layer may be formed of a polysilicon layer or a metal layer. The metal layer may be a tungsten layer. The conductive layer is patterned, forming first and second interconnections 110a and 110b spaced from each other, and concurrently, forming at least one supporting pattern 110s between the first and second interconnections 110a and 110b. In this case, the first and second interconnections 110a and 110b, and the supporting pattern 110s are formed at a same level. Alternatively, the first and second interconnections 110a and 110b, and the supporting pattern 110s may be formed at levels different from each other. For example, first and second interconnections 110a and 110b are first formed on the substrate 100, and a lower insulating layer 105 is formed to cover the first and second interconnections 110a and 110b. Then, a supporting pattern 110s may be formed on the lower insulating layer 105. An insulating layer 120 is formed to cover the first and second interconnections 110a and 110b, and the supporting pattern 110s.

The insulating layer 120 is patterned, forming first and second contact holes 125a and 125b exposing the first and second interconnections 110a and 110b, and forming a supporting contact hole 125s exposing the supporting pattern 110s.

Figure 5:
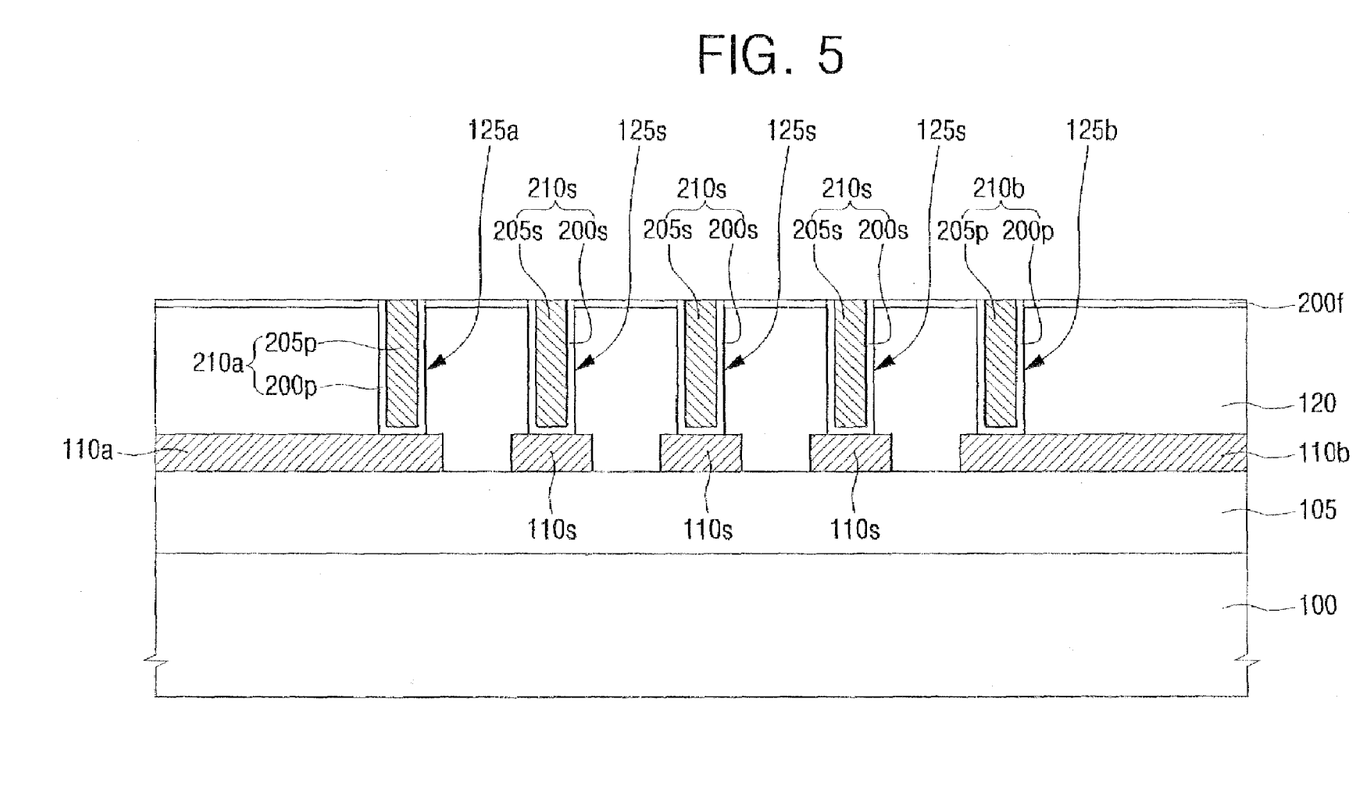

Referring to FIGS. 1 and 5, a barrier layer is conformally formed on the inner walls of the contact holes 125a, 125b, and 125s, and on the insulating layer 120. The barrier layer includes a contact barrier layer 200p formed on the inner walls of the first and second contact holes 125a and 125b, a plug barrier layer 200s formed on the inner wall of the supporting contact hole 125s, and a fuse barrier layer 200f formed on the insulating layer 120. The barrier layer may be composed of a titanium layer and a titanium nitride layer, which are stacked. Then, a conductive layer is formed on the barrier layer to fill the contact holes 125a, 125b, and 125s. The conductive layer may be formed of a metal layer such as a tungsten layer or an aluminum layer. The conductive layer may be planarized until the fuse barrier layer 200f is exposed. As a result, a contact layer 205p filling the first and second contact holes 125a and 125b, and a plug layer 205s filling the supporting contact hole 125s are formed. The contact barrier layer 200p and the contact layer 205p formed inside the first contact hole 125a form a first contact plug 210a. The contact barrier layer 200p and the contact layer 205p formed inside the second contact hole 125b form a second contact plug 210b. The plug barrier layer 200s and the plug layer 205s formed inside the supporting contact hole 125s form a supporting plug 210s.

Figure 6:
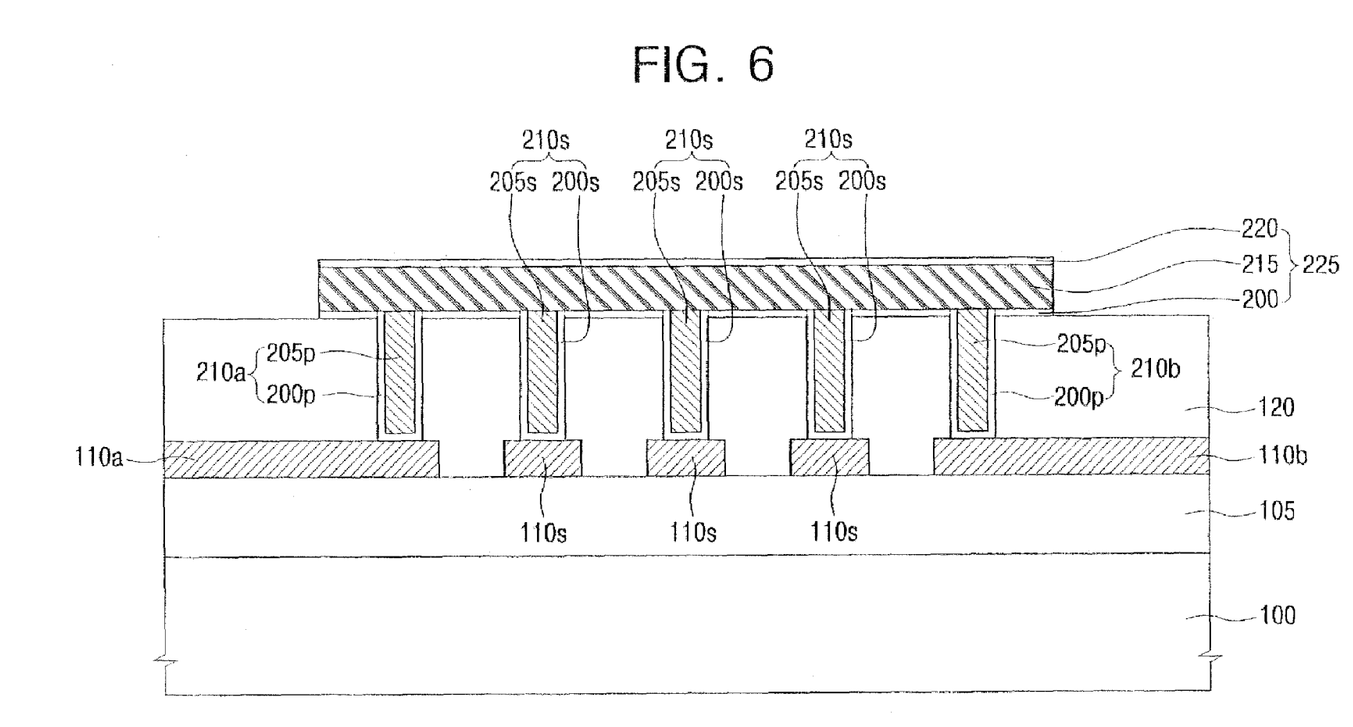

Referring to FIGS. 1 and 6, a fuse conductive layer and an anti-reflective layer are sequentially formed on the fuse barrier layer 200f to cover the plugs 210a, 210b, and 210s. The fuse conductive layer may be formed of the same material layer as that of the contact layer 205p and the plug layer 205s, or may be formed of a different material layer. The fuse conductive layer may be formed of an aluminum layer. The anti-reflective layer, the fuse conductive layer, and the fuse barrier layer 200f are patterned, thereby forming a fuse barrier pattern 200, a fuse conductive pattern 215, and an anti-reflective pattern 220, which are sequentially stacked. The fuse barrier pattern 200, the fuse conductive pattern 215, and the anti-reflective pattern 220 form a fuse 225. The fuse 225 covers the plugs 210a, 210b, and 210s. As a result, the plugs 210a, 210b, and 210s may contact the fuse conductive pattern 215.

Referring to FIGS. 1 and 7, an upper insulating layer 230 is formed on the whole surface of the substrate having the fuse 225. An upper insulating layer 230 may include a lower passivation layer such as a plasma oxide layer, and an upper passivation layer such as a plasma nitride layer. The upper insulating layer 230 is patterned, thereby forming a fuse window 235 exposing the fuse 225. The anti-reflective pattern 220 may be also patterned and removed during the formation of the fuse window 235. In addition, the fuse conductive pattern 215 below the anti-reflective pattern 220 may be partially etched, thereby forming a portion of the fuse conductive pattern 215 having a thinner thickness.

FIGS. 8 through 11 are sectional views taken along a line I-I' of FIG. 1 to explain a method of fabricating a fuse region according to another embodiment.

Figure 8:
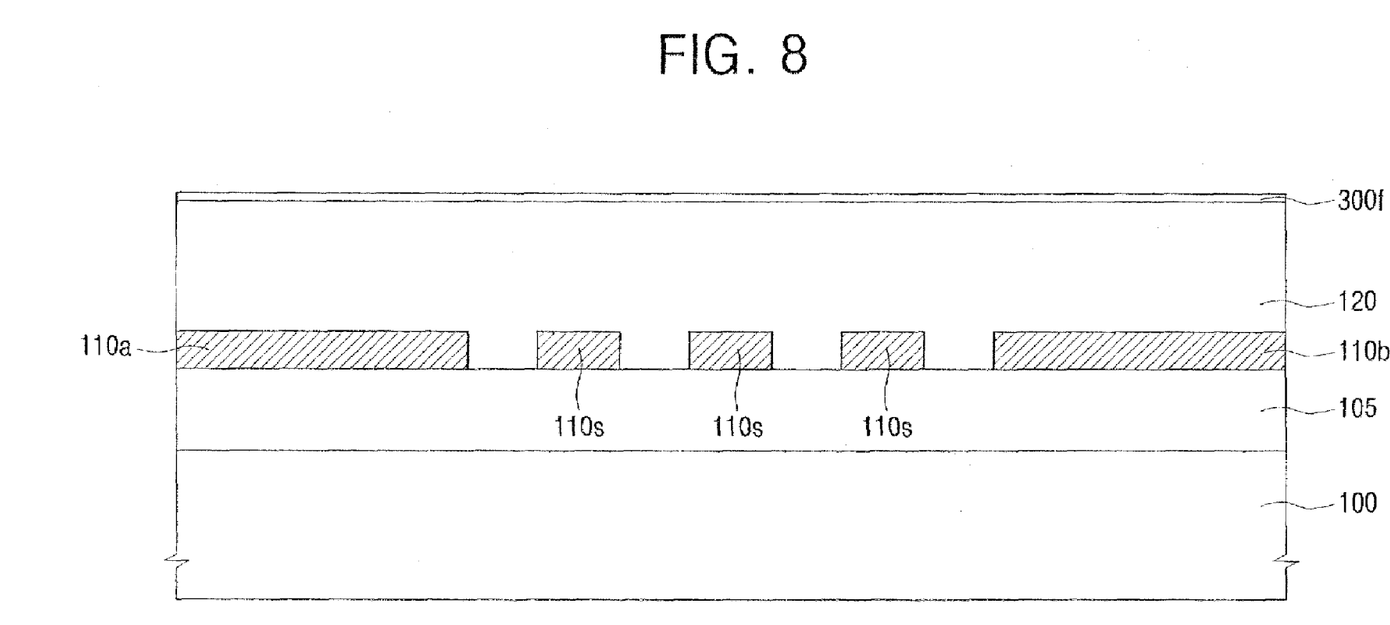

Referring to FIGS. 1 and 8, a lower insulating layer 105, first and second interconnections 110a and 110b, a supporting pattern 10s, and an insulating layer 120 are formed on a substrate 100 using the same method as described in reference to FIG. 3. A fuse barrier layer 300f is formed on the insulating layer 120. The fuse barrier layer 300f may be formed by stacking a titanium layer and a titanium nitride layer sequentially.

Figure 9:
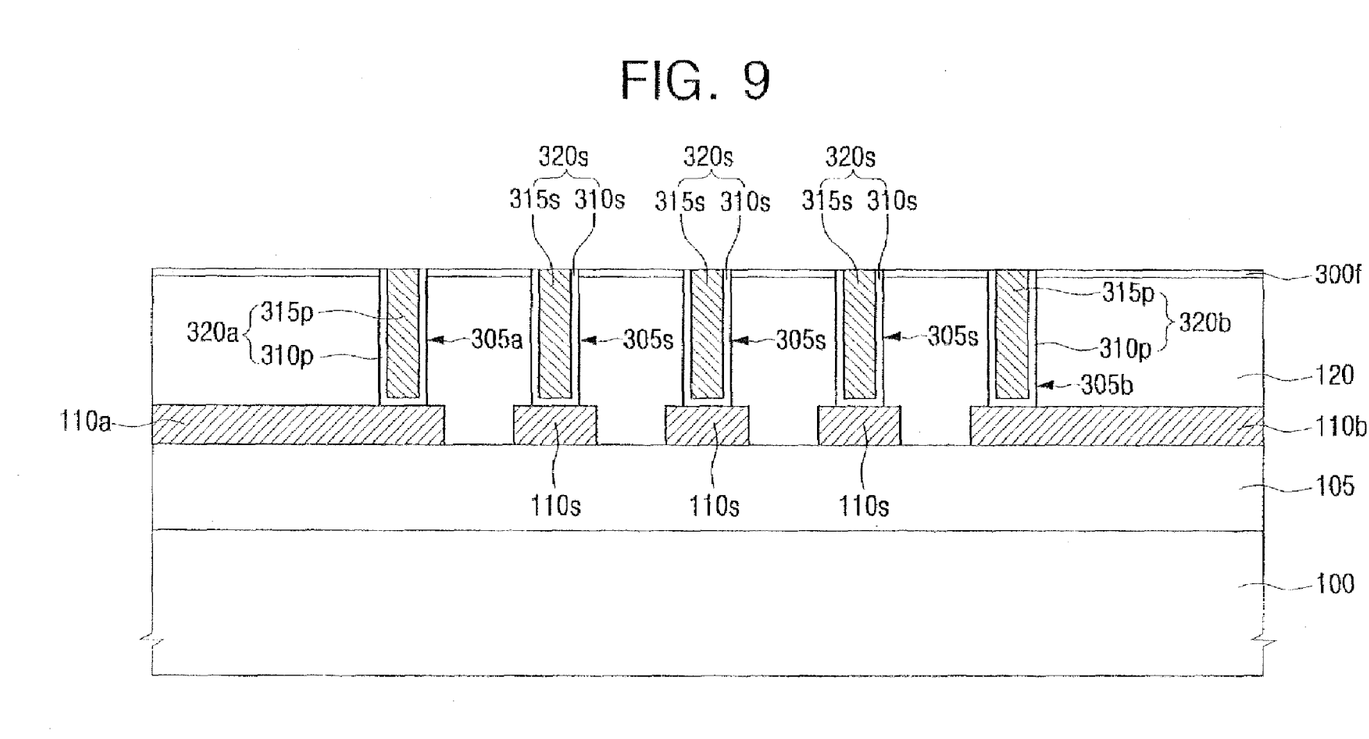

Referring to FIGS. 1 and 9, the fuse barrier layer 300f and the insulating layer 120 are patterned, forming first and second contact holes 305a and 305b exposing the first and second interconnections 110a and 110b, and forming a supporting contact hole 305s exposing the supporting pattern 110s. First and second contact plugs 320a and 320b are formed to fill the first and second contact holes 305a and 305b, and a supporting plug 320s is formed to fill the supporting contact hole 305s. Each of the first and second contact plugs 320a and 320b may include a contact layer 315p, and a contact barrier layer 310p surrounding the contact layer 315p. The supporting plug 320s may include a plug layer 315s, and a plug barrier layer 310s surrounding the plug layer 315s. In particular, a barrier layer is conformally formed on the substrate having the contact holes 305a, 305b, and 305s, and then, a conductive layer filling the contact holes 305a, 305b, and 305s is formed on the barrier layer. The barrier layer may be formed by stacking a titanium layer and a titanium nitride layer sequentially, and the conductive layer may be formed of a metal layer such as a tungsten layer or an aluminum layer. The conductive layer and the barrier layer are planarized until the fuse barrier layer 300f is exposed, thereby forming the first and second contact plugs 320a and 320b, and the supporting plug 320s. While the conductive layer and the barrier layer are planarized, a portion of the fuse barrier layer 300f may be removed.

Figure 10:
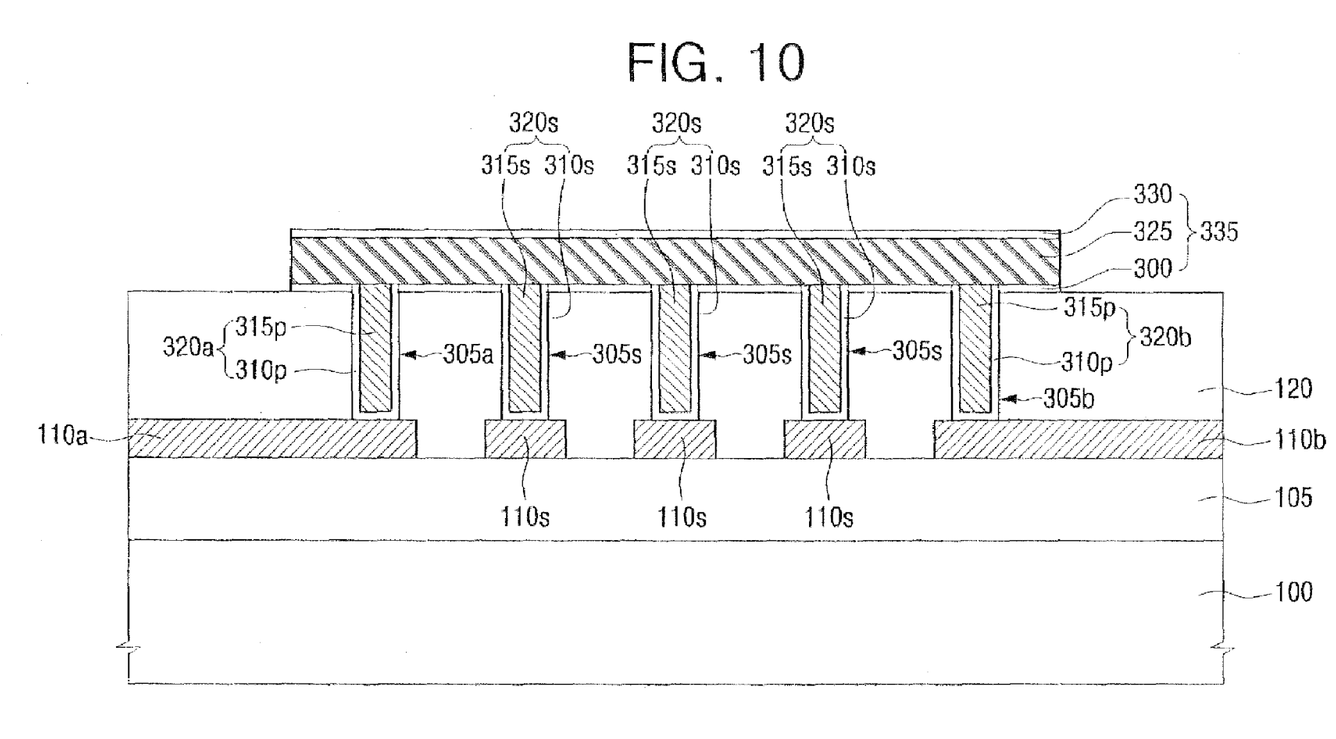
Figure 11:
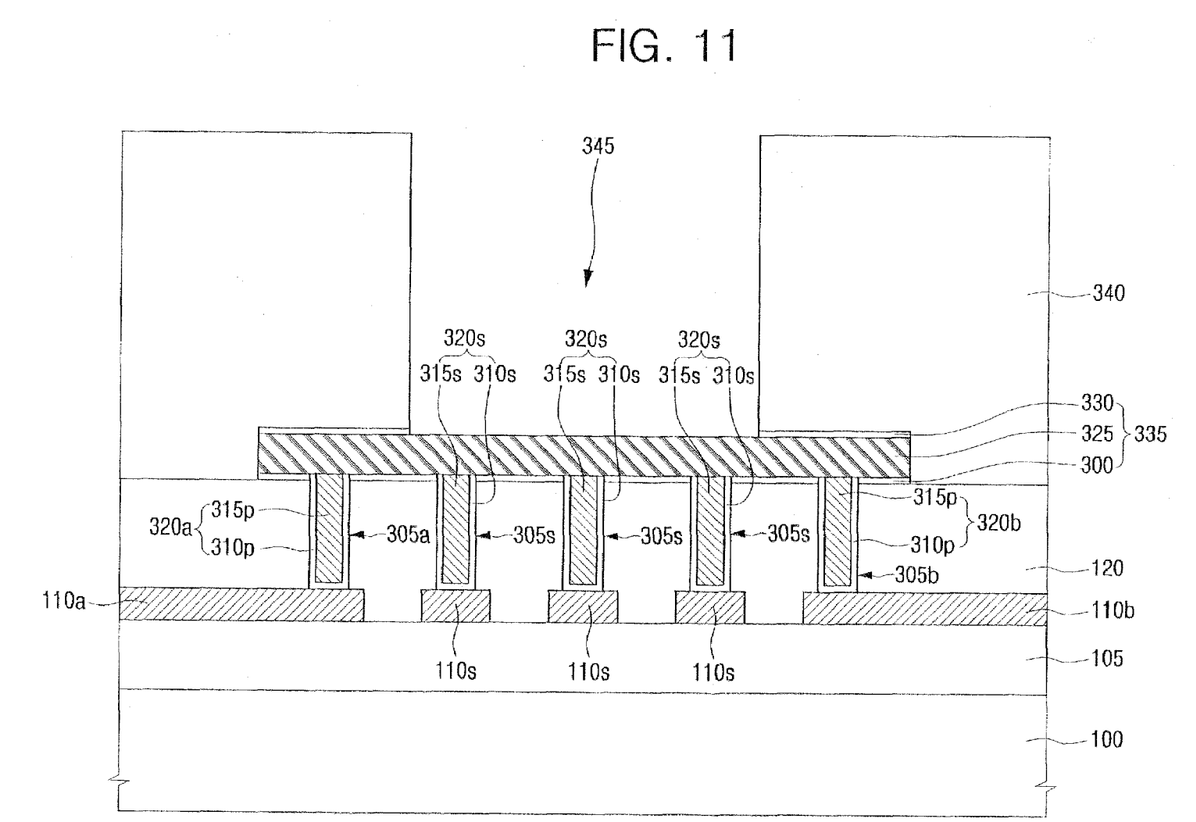

Referring to FIGS. 1, 10, and 11, a fuse conductive layer and an anti-reflective layer covering the plugs 320a, 320b, and 320s are sequentially formed on the fuse barrier layer 300f. The anti-reflective layer, the fuse conductive layer, and the fuse barrier layer 300f are patterned, thereby forming a fuse barrier pattern 300, a fuse conductive pattern 325, and an anti-reflective pattern 330, which are sequentially stacked. The fuse barrier pattern 300, the fuse conductive pattern 325, and the anti-reflective pattern 330 form a fuse 335. The fuse 335 is formed to cover the plugs 320a, 320b, and 320s. As a result, the plugs 320a, 320b, and 320s may contact the fuse contact pattern 325. An upper insulating layer 340 is formed on the whole surface of the substrate having the fuse 335. The upper insulating layer 340 is patterned, thereby forming a fuse window 345 exposing the fuse 335. During the formation of the fuse window 345, the anti-reflective pattern 330 may be patterned and removed. As well as the anti-reflective pattern 330, the fuse conductive pattern 325 below the anti-reflective pattern 330 may be partially etched, thereby forming a fuse conductive pattern 325 having a thinner thickness.

Figure 12:
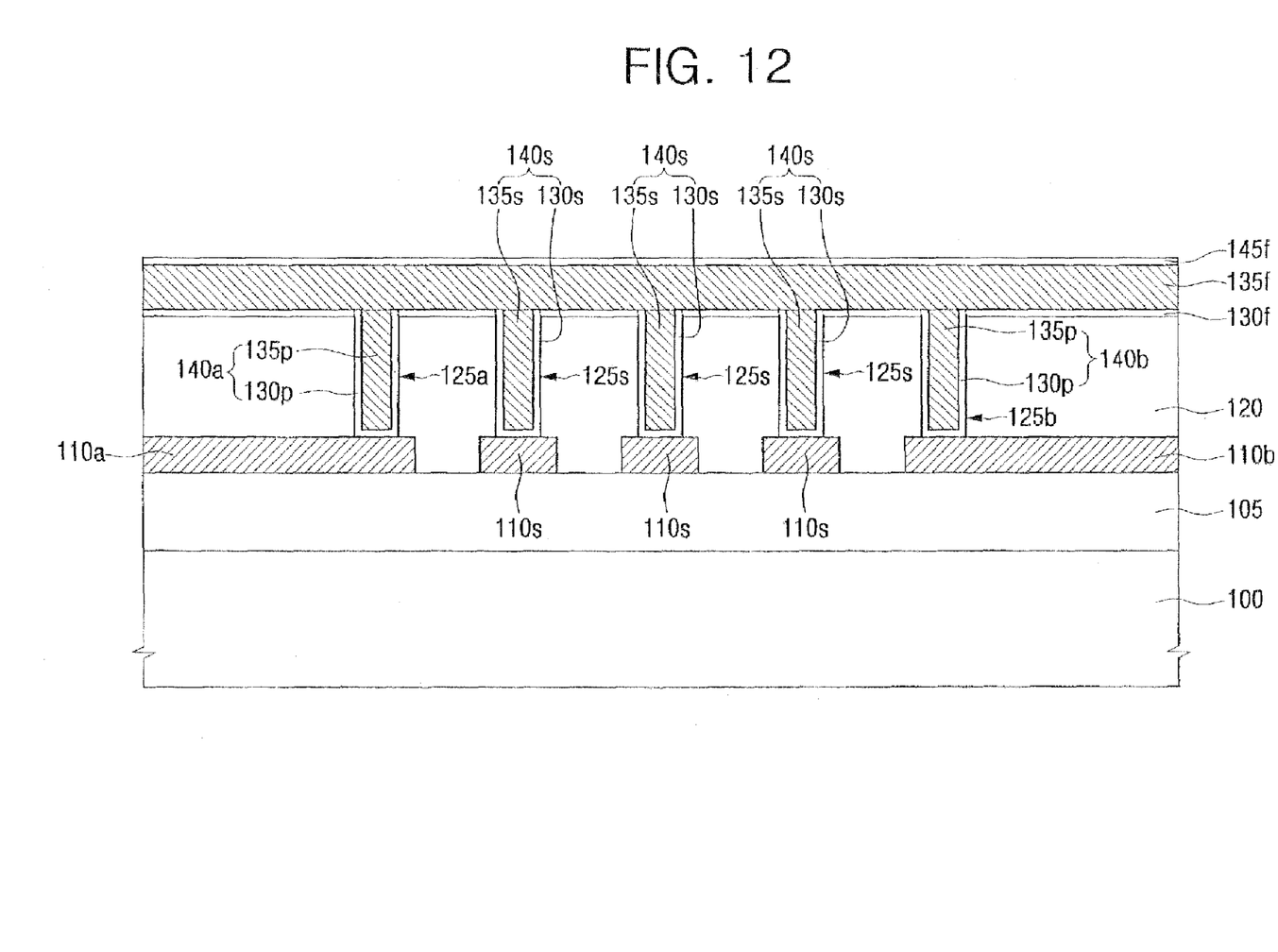
Figure 13:
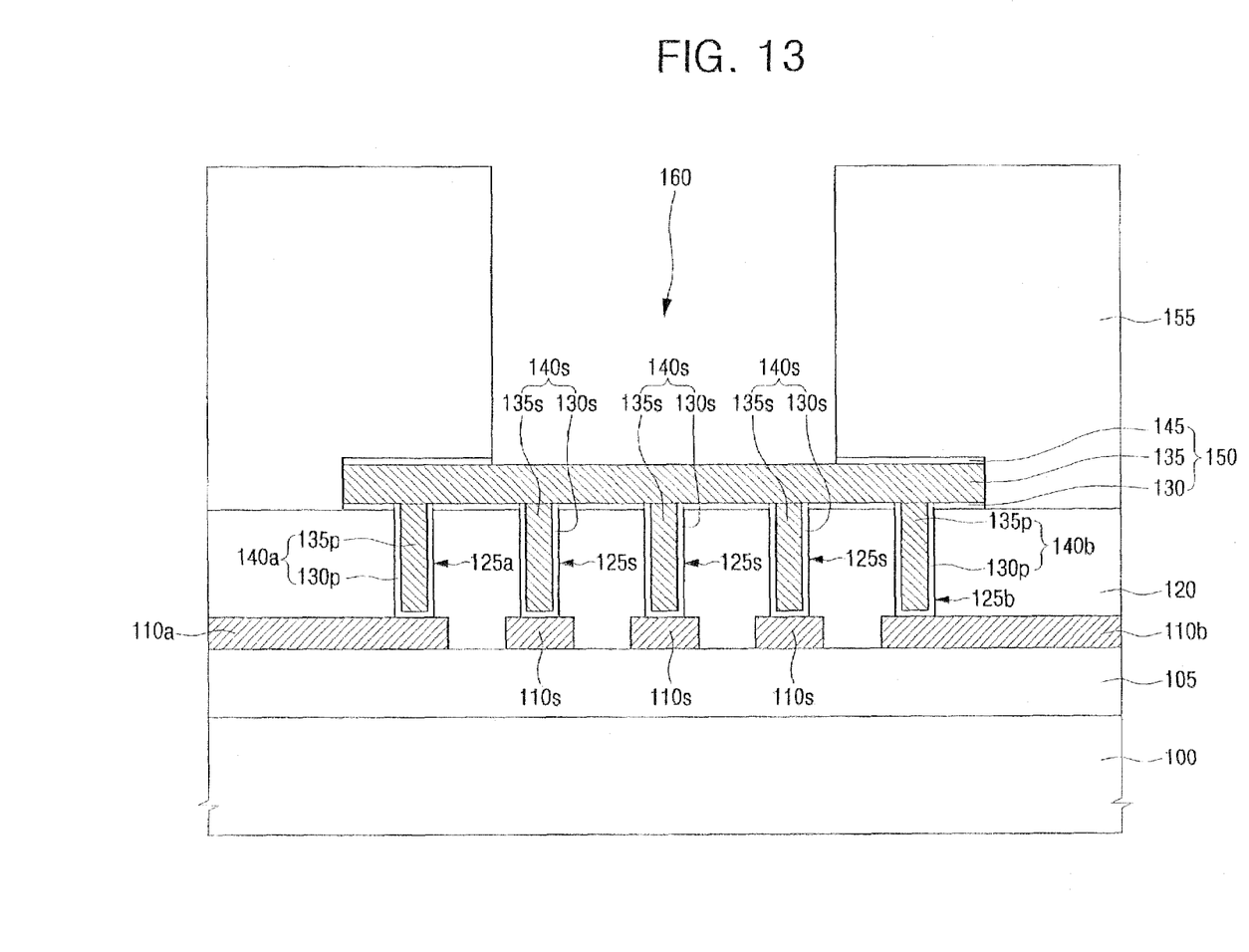

FIGS. 12 and 13 are sectional views taken along a line I-I' of FIG. 1 to explain a method of fabricating a fuse region according to another embodiment.

Referring to FIGS. 1 and 12, contact holes 125*a*, 125*b*, and 125*s* are formed inside the insulating layer 120, using the same method as described in reference to FIGS. 3 and 4. A barrier layer is conformally formed on the inner walls of the contact holes 125*a*, 125*b*, and 125*s* and on the insulating layer 120. The barrier layer is composed of a contact barrier layer 130*p* formed on the inner walls of the first and second contact holes 125*a* and 125*b*, a plug barrier layer 130*s* formed on the inner wall of the supporting contact hole 125*s*, and a fuse barrier layer 130*f* formed on the insulating layer 120. Then, a conductive layer is formed to fill the contact holes 125*a*, 125*b*, and 125*s*, and to cover the whole surface of the substrate having the barrier layer. A process of planarizing the upper surface of the conductive layer may be further performed. As a result, a contact layer 130*p* is formed to fill the first and second contact holes 125*a* and 125*b*, a plug layer 130*s* is formed to fill the supporting contact hole 125*s*, and a fuse conductive layer 135*f* is formed on the fuse barrier layer 130*f*. An anti-reflective layer 145*f* may be formed on the fuse conductive layer 135*f*.

Referring to FIGS. 1 and 13, the anti-reflective layer 145*f*, the fuse conductive layer 135*f*, and the fuse barrier layer 130*f* are sequentially patterned, thereby forming a fuse 150, which is composed of a fuse barrier pattern 130, a fuse conductive pattern 135, and an anti-reflective pattern 145, which are sequentially stacked. Then, an upper insulating layer 155 is formed on the whole surface of the substrate having the fuse 150. The upper insulating layer 155 is patterned, forming a fuse window 160 exposing the fuse 150. During the formation of the fuse window 160, the anti-reflective pattern 145 may be also patterned and removed. In addition, the fuse conductive pattern 135 below the anti-reflective pattern 145 may be partially etched, forming a fuse conductive pattern 135 having a relatively thin thickness.

The structure according to the embodiment illustrated in FIG. 2 can be fabricated using the same method as described in reference to FIGS. 3 through 13.

According to an embodiment described above, the fuse region comprises an insulating layer disposed on a substrate; and a fuse disposed on the insulating layer and comprising a fuse barrier pattern and a fuse conductive pattern, which are stacked. The supporting plug is disposed to penetrate the insulating layer and the fuse barrier pattern, and supporting the fuse. That is, the contact area between the fuse and a Titanium nitride barrier layer of the present invention is smaller than that of the related art. Accordingly, the stress applied to a fuse due to the expansion of a Titanium nitride barrier layer is dispersed, thereby preventing the fuse from breaking as bad influences, and the like.

Although particular embodiments have been described, modifications and variations can be made by persons skilled in the art in light of the above descriptions without departing from the scope and the spirit of the following claims.

What is claimed is:

1. A method of fabricating a fuse region comprising:
   forming a first interconnection, a second interconnection, and a third interconnection on a substrate, the third interconnection being formed between the first and second interconnections;
   forming an insulating layer over the first, second, and third interconnections;
   forming a supporting plug, a first contact plug, and a second contact plug penetrating the insulating layer, wherein the first contact plug is in contact with the first interconnection, the second contact plug is in contact with the second interconnection, and the supporting plug is in contact with the third interconnection; and
   forming a fuse on the insulating layer, the fuse including a fuse barrier pattern and a fuse conductive pattern, which are stacked, the fuse formed such that the supporting plug and the first and second contact plugs penetrate the fuse barrier pattern, wherein the fuse conductive pattern is in contact with the supporting plugs and the first and second contact plugs.

2. The method according to claim 1, wherein the forming of the supporting plug comprises:
   forming a supporting contact hole penetrating the insulating layer;
   forming a barrier layer on an inner wall of the supporting contact holes and over the substrate; and
   forming a conductive layer over the barrier layer to fill the supporting contact hole.

3. The method according to claim 2, wherein forming the fuse comprises patterning the conductive layer and the barrier layer.

4. The method according to claim 2, which further comprises, after forming the conductive layer, planarizing the conductive layer such that the barrier layer is exposed on the insulating layer.

5. The method according to claim 4, wherein forming the fuse comprises:
   forming a fuse conductive layer on the barrier layer; and
   patterning the fuse conductive layer and the barrier layer.

6. The method according to claim 1, which further comprises, before forming the supporting plug, forming a fuse barrier layer on the insulating layer.

7. The method according to claim 6, wherein the forming of the supporting plug comprises:
   forming the supporting contact hole penetrating the fuse barrier layer and the insulating layer;
   forming a plug barrier layer covering an inner wall of the supporting contact hole; and
   forming a plug layer filling the supporting contact hole on the plug barrier layer.

8. The method according to claim 7, wherein the forming of the fuse comprises:
   forming a fuse conductive layer covering the supporting plug on the fuse barrier layer; and
   patterning the fuse conductive layer and the fuse barrier layer.

9. A method of fabricating a fuse region comprising:
   forming an insulating layer on a substrate;
   forming a fuse barrier layer on the insulating layer;
   forming a supporting plug, a first contact plug, and a second contact plug penetrating the insulating layer and the fuse barrier layer, wherein the supporting plug is between the first contact plug and the second contact plug; and
   forming a fuse on the insulating layer, the fuse including a fuse barrier pattern formed from the fuse barrier layer and a fuse conductive pattern, which are stacked, wherein the fuse conductive pattern is in contact with the supporting plug, the first contact plug, and the second contact plug.

10. A method of fabricating a fuse region comprising:
    forming a first interconnection and a second interconnection on a substrate;
    forming an insulating layer over the first interconnection and the second interconnection;
    forming a supporting plug, a first contact plug, and a second contact plug penetrating the insulating layer, wherein the first contact plug is in contact with the first interconnection, the second contact plug is in contact with the second interconnection, and the supporting plug is between the first contact plug and the second contact plug; and forming a fuse on the insulating layer, the fuse including a fuse barrier pattern and a fuse conductive pattern, which are stacked, the fuse formed such that the supporting plug penetrates the fuse barrier pattern, wherein the fuse conductive pattern is in contact with the supporting plug, the first contact plug, and the second contact plug.

11. The method according to claim 9, further comprising:
patterning the fuse barrier layer and the insulating layer to form a first contact hole, a second contact hole, and a supporting contact hole;
wherein forming the supporting plug, the first contact plug, and the second contact plug comprises forming the first contact plug, the second contact plug, and the supporting plug in the first contact hole, the second contact hole, and the supporting contact hole, respectively, after patterning the fuse barrier layer and the insulating layer.

* * * * *

UNITED STATES PATENT AND TRADEMARK OFFICE
CERTIFICATE OF CORRECTION

PATENT NO. : 7,592,206 B2  Page 1 of 1
APPLICATION NO. : 11/457787
DATED : September 22, 2009
INVENTOR(S) : Eung-Youl Kang et al.

It is certified that error appears in the above-identified patent and that said Letters Patent is hereby corrected as shown below:

Column 2, line 48, the word "110'b." should read -- 110b'. --;
Column 5, line 63, the word "210h" should read -- 210b --;
Column 6, line 15, the word "10s," should read -- 110s, --;
Column 8, line 35, the words "forming the" should read -- forming a --.

Signed and Sealed this

Eighth Day of December, 2009

David J. Kappos
*Director of the United States Patent and Trademark Office*